(12) United States Patent
Dai et al.

(10) Patent No.: US 6,211,740 B1
(45) Date of Patent: Apr. 3, 2001

(54) SWITCHING A CLOCKED DEVICE FROM AN INITIAL FREQUENCY TO A TARGET FREQUENCY

(75) Inventors: Xia Dai, San Jose, CA (US); Keng Wong, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/408,134

(22) Filed: Sep. 29, 1999

(51) Int. Cl.[7] ............................... H03L 7/07; H03L 7/22
(52) U.S. Cl. ....................... 331/2; 331/14; 331/16; 331/25; 713/501
(58) Field of Search .................... 331/2, 14, 16, 331/25; 713/501

(56) References Cited

U.S. PATENT DOCUMENTS

| 4,659,999 | * | 4/1987 | Motoyama et al. | 331/2 |
| 5,434,888 | * | 7/1995 | Fukuchi | 331/2 |
| 5,838,205 | * | 11/1998 | Ferraiolo et al. | 331/2 |

* cited by examiner

Primary Examiner—Siegfried H. Grimm
(74) Attorney, Agent, or Firm—Fish & Richardson, P.C.

(57) ABSTRACT

Switching a clocked device from an initial frequency to a target frequency includes locking a first phase locked loop (PLL) to the target frequency while a second PLL is driving a clock distribution network at the initial frequency. The first PLL is then substituted for the second PLL on the clock distribution network.

24 Claims, 8 Drawing Sheets

SWITCHING A CLOCKED DEVICE FROM AN INITIAL FREQUENCY TO A TARGET FREQUENCY

BACKGROUND OF THE INVENTION

This invention relates to switching a clocked device from an initial frequency to a target frequency.

When switching the frequency of a device's internal clock from an initial to a target frequency, the target frequency should remain in phase with a master external clock. In microprocessors and other clocked devices, this is done using a phase locked loop ("PLL").

Typically, frequencies are changed in a clocked device by placing the device in an idle state, changing the frequency to the target frequency, and locking the device's PLL in phase with the target frequency. The length of the idle state required for the changing and locking to occur slows down device operation.

SUMMARY OF THE INVENTION

In general, in one aspect of the invention, a clocked device is switched from an initial frequency to a target frequency by locking a first PLL to the target frequency while a second PLL is driving a clock distribution network at the initial frequency. The first PLL is then substituted for the second PLL on the clock distribution network.

Among the advantages of the invention may be one or more of the following. Frequency switching can be effected relatively seamlessly, with little or no idle time between operation at different frequencies (called "switching latency"). Reductions in idle time make it possible to change device frequencies gradually, thereby reducing transient currents in the device.

Frequency switching also permits devices to change their operational speed and power consumption. For example, operation at higher frequencies requires more power than operation at lower frequencies. Accordingly, it is possible to cause the device to enter a low-power mode by switching from a high to a low device operational frequency.

Other advantages and features of the invention will become apparent from the following description and the claims.

DESCRIPTION

Figure 1:
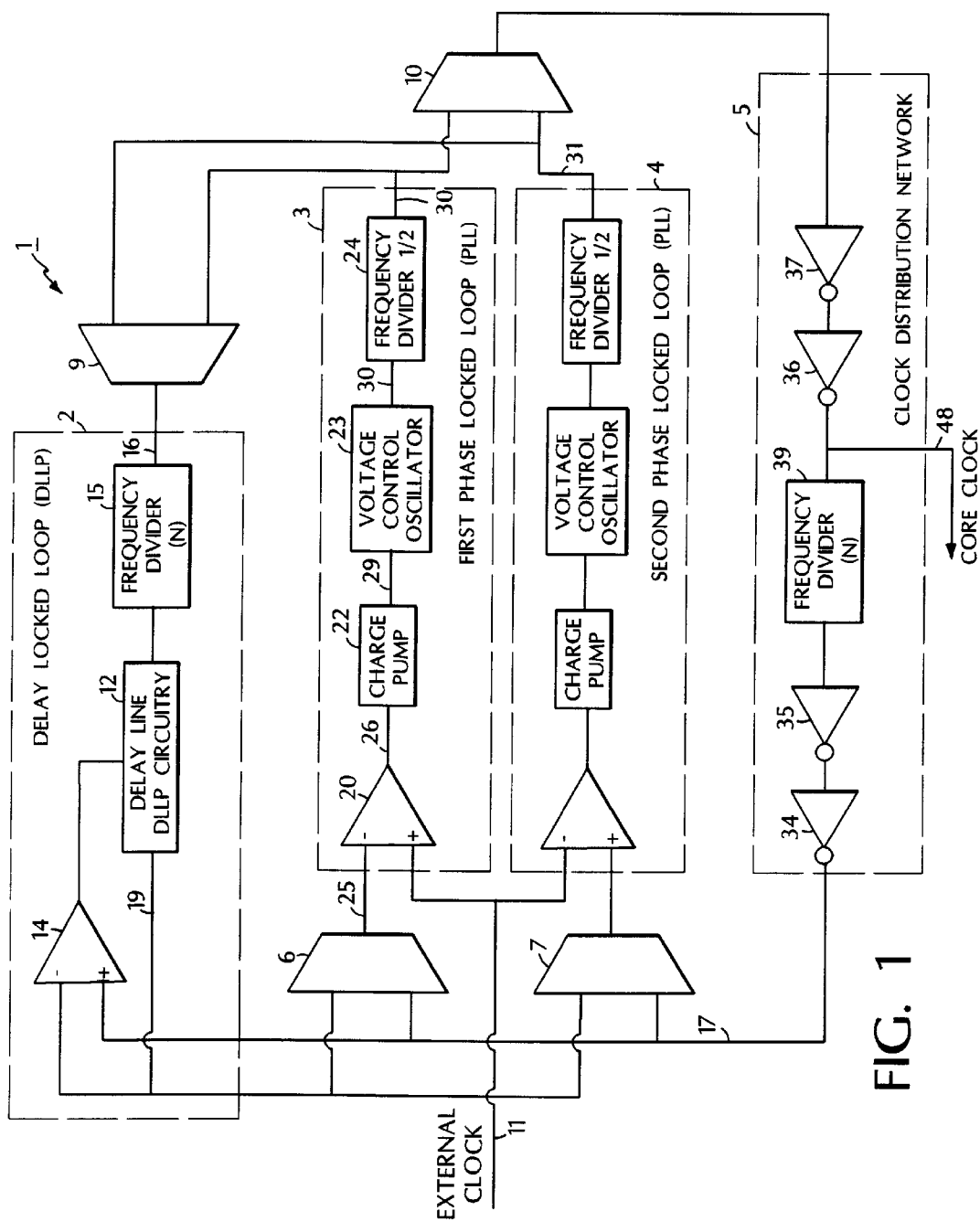
FIGS. 1, 2 and 4 to 7 show clocking circuitry according to one embodiment of the invention.

In FIG. 1, clocking circuitry 1 includes, among other things, a delay locked loop ("DLLP") 2, first PLL 3, second PLL 4, clock distribution network 5, and switches 6, 7, 9 and 10. A "master" external clocking signal 11 is connected to first PLL 3 and second PLL 4 as shown. External clocking signal 11 may be a bus clock external to clocking circuitry 1.

DLLP 2 contains DLLP circuitry 12, phase comparator 14, and frequency divider 15. Frequency divider 15 divides a clocking signal on 16 by a value "N" that is greater than zero. Phase comparator 14 compares arrival times of a feedback signal 17 from clock distribution network 5 (see below) and a clocking signal fed through DLLP circuitry 12 on 19. DLLP circuitry 12 uses the arrival time information from phase comparator 14 to determine a delay between feedback signal 17 and clocking signal 19. DLLP circuitry 12 then stores this delay. When DLLP circuitry 12 is locked, the delay stored on DLLP circuitry is such that the delay from 31 (described below) to 19 is the same as the delay from 31 to 17.

First PLL 3 contains phase comparator 20, charge pump 22, voltage control oscillator ("VCO") 23, and frequency divider 24. Phase comparator 20 compares the arrival times of external clocking signal 11 and a clocking signal on 25 to detect a difference between the two signals. This clocking signal may be either feedback signal 17 or a clocking signal that has been output from first PLL 3 and passed through DLLP 2 to 19. Phase comparator 20 outputs a control signal 26 to charge pump 22 based on this difference. Control signal 26 may instruct charge pump 22 to output more, less, or the same amount of voltage. Charge pump 22 then outputs an appropriate amount of voltage 29. VCO 23 generates first PLL clocking signal 30 based on the amount of voltage 29 output by charge pump 22. An increase in voltage causes VCO 23 to increase the frequency of clocking signal 30, and a decrease in voltage causes VCO 23 to decrease the frequency of that clocking signal.

Frequency divider 24 multiplies the frequency of clocking signal 30 by "½" prior to output from first PLL 3. A value of "½" has been selected here because it produces a square wave with a 50% duty cycle. Other (even) values, however, may be used in place of "½".

Second PLL 4 is substantially identical to first PLL 3. It is their connections to other circuits in clocking circuitry 1, which are controlled by switches 6, 7, 9 and 10 (multiplexers, or the like), that differentiates the operations of second PLL 4 and first PLL 3.

Switch 6 connects either feedback signal 17 or clocking signal 30 to first PLL 3. Switch 7 connects either feedback signal 17 or a second PLL clocking signal 31 (the second PLL counterpart to clocking signal 30) to second PLL 4. Switch 9 connects either clocking signal 30 or clocking signal 31 to DLLP 2. Switch 10 connects either first PLL 3 or second PLL 4 to clock distribution network 5. Whichever of these PLLs is connected provides the core clock for clocking circuitry 1. Switching specifics are described below.

Figure 8:
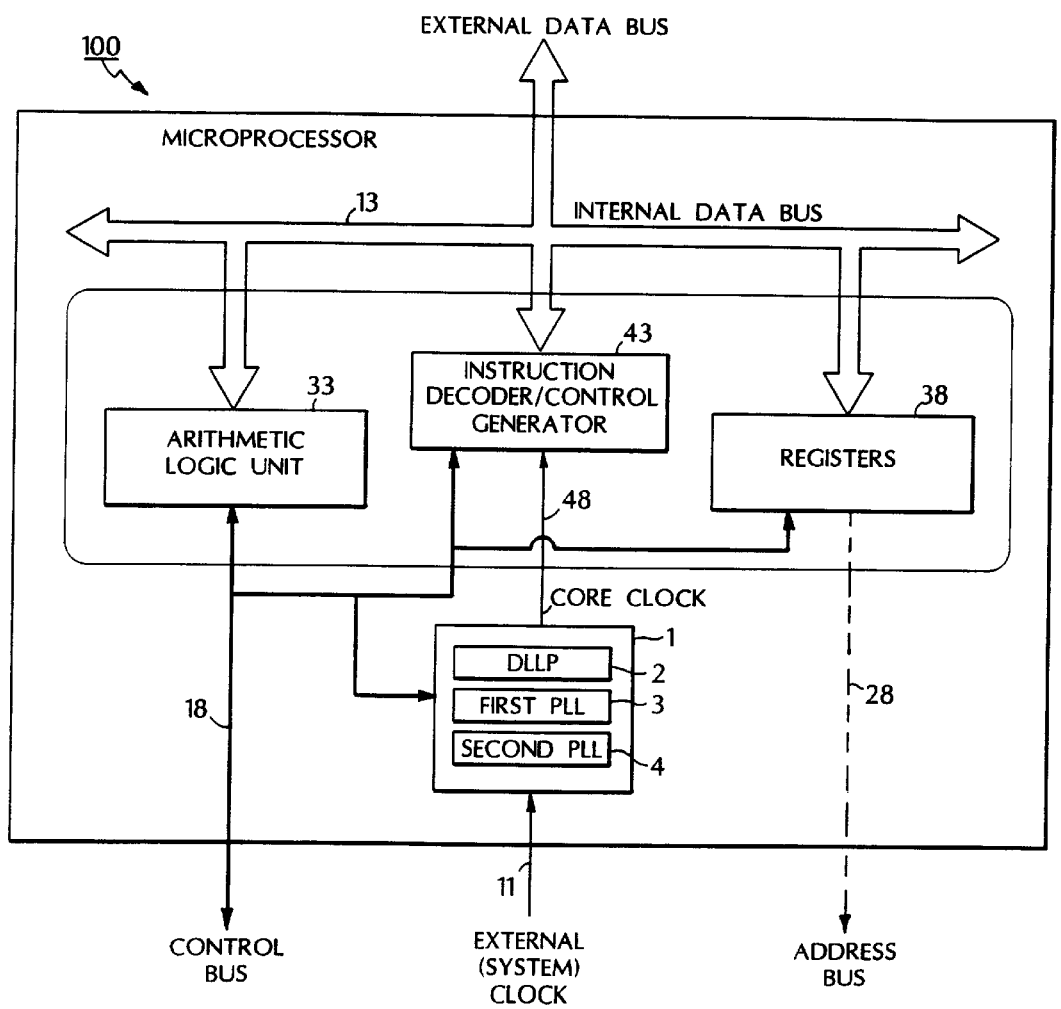
FIG. 8 shows a microprocessor that includes the clocking circuitry.

Clock distribution network 5 includes drivers 34 to 37 and frequency divider 39. Core clock 48, for a processor or other device being clocked by clocking circuitry 1, is the output signal from driver 36. For example, referring to FIG. 8, processor 100 include one or more of instruction decoder/control generator 43, arithmetic logic unit ("ALU") 33, and registers 38 (data bus 13, control bus 18, and address bus 28 are shown for completeness). Clocking circuitry 1 provides core clock 48 to instruction decoder/control generator 43, which clocks the remaining components based on the core clock.

Returning to FIG. 1, drivers 34 to 37 drive clocking signals through clock distribution network 5. Frequency divider 39 is identical to frequency divider 15, although it may have a different value of "N". Clocking signals output from clock distribution network 5 are fed back to DLLP 2, first PLL 3, and second PLL 4 as feedback signal 17.

Figure 2:
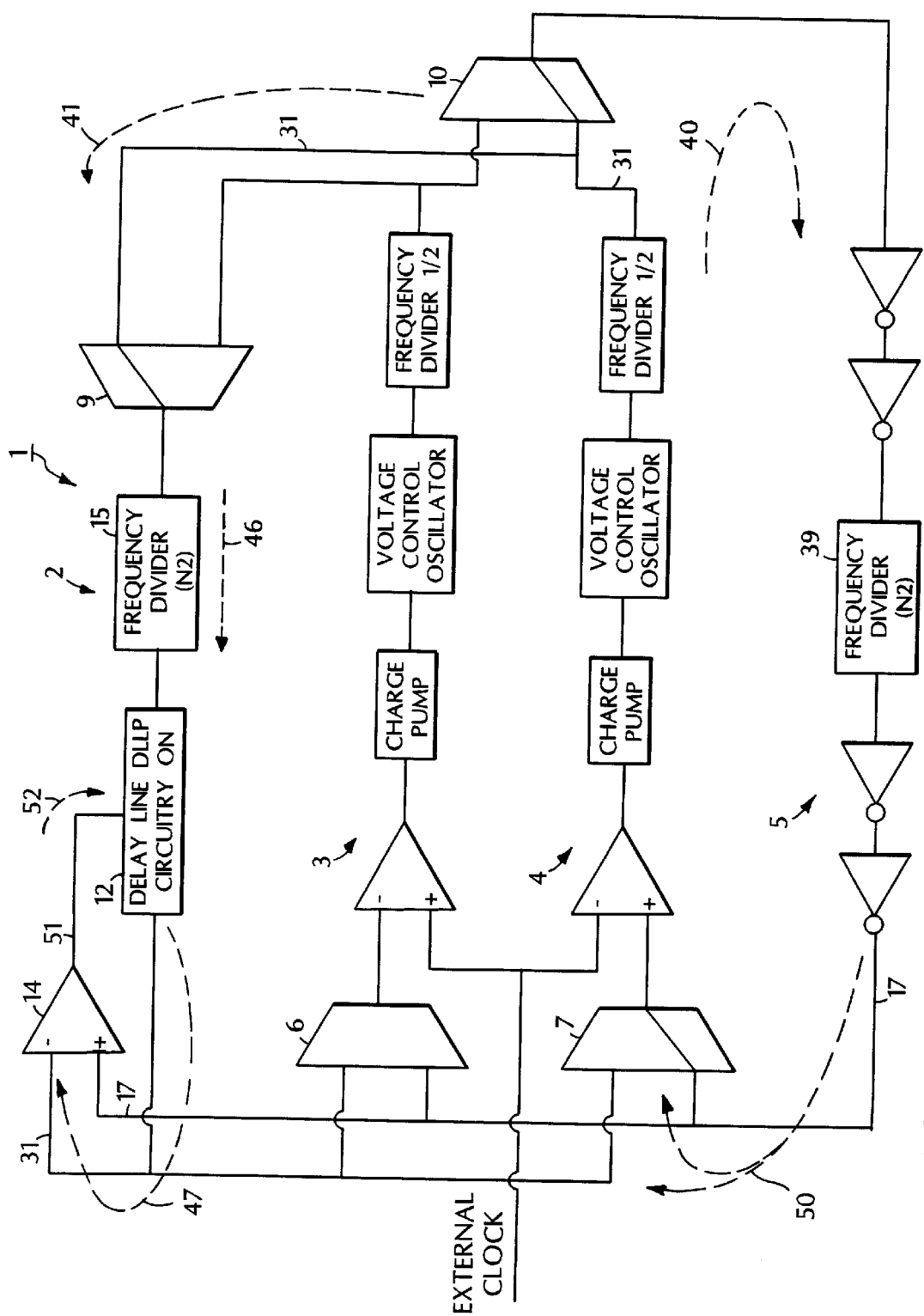

The circuitry of FIG. 1 is used to switch an internal/core clock of a device, such as processor 100 (FIG. 8), from an initial frequency, such as 250 MHz, to a target frequency, such as 500 MHz. FIG. 2 sets the stage for a representative implementation of this process.

In FIG. 2, switch 7 is configured to provide feedback signal 17 to an input of second PLL 4; switch 10 is configured to output clocking signal 31 from second PLL 4 to clock distribution network 5; and frequency divider 39 is set at an initial value of "N2". In this configuration, second PLL 4 is driving clocking signal 31 over clock distribution network 5 (clocking signal 31 is the core clock) at a frequency that corresponds to "N2" (see arrow 40 for signal direction). Also, switch 9 is configured to provide clocking signal 31 to DLLP 2 (see arrow 41) and switch 6 is configured not to provide an input to first PLL 3, leaving first PLL 3 idle.

Figure 3:
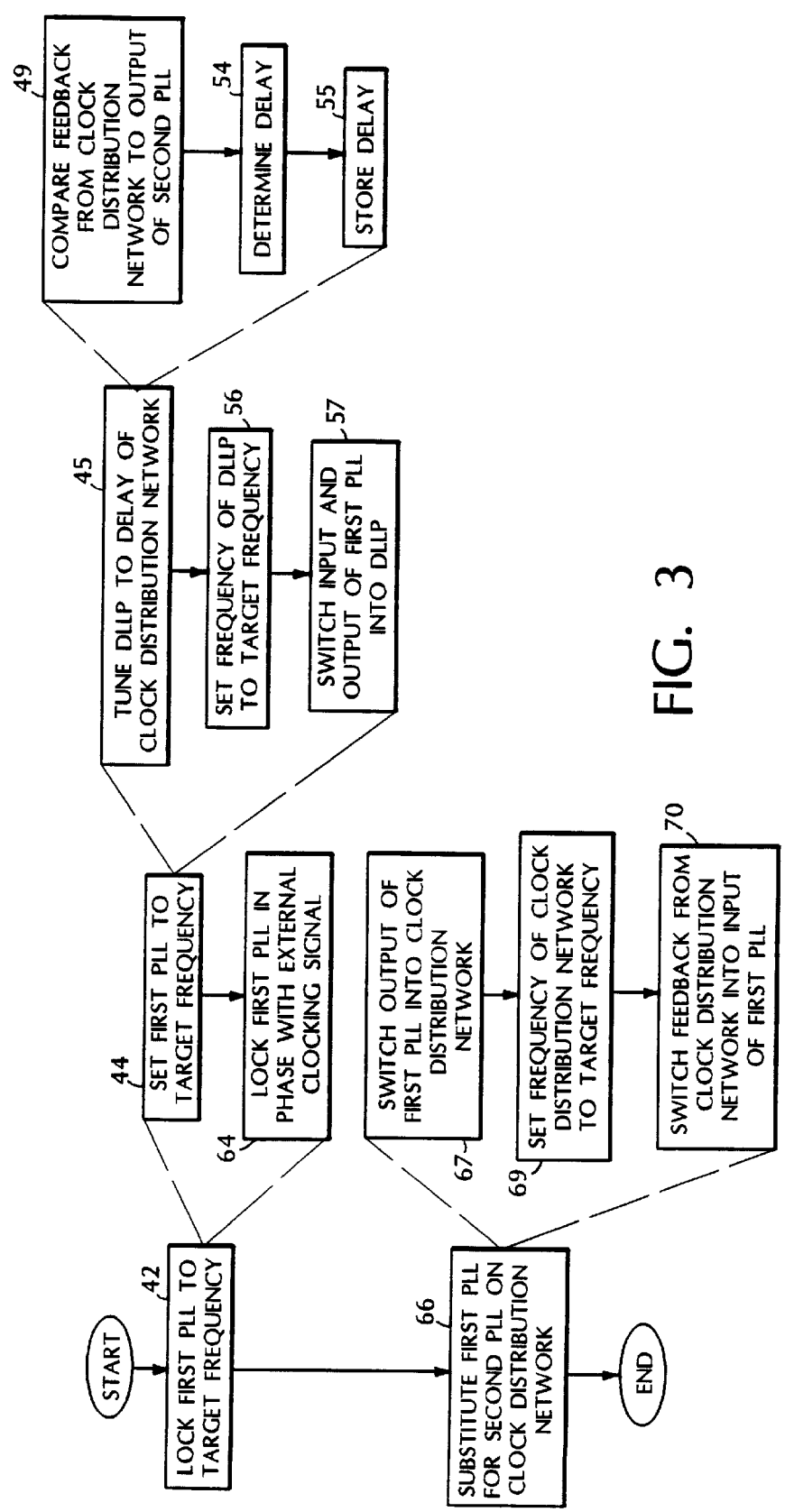
FIG. 3 shows a process according to one embodiment of the invention for switching frequencies of the clocking circuitry.

Referring to FIG. 3, clocking circuitry 1 locks 42 first PLL 3 to the target frequency while second PLL 4 is driving clock distribution network 5 at the initial frequency. Clocking circuitry 1 sets 44 first PLL 3 to the target frequency by tuning 45 DLLP 2 to a delay of clock distribution network 5. This is done as follows.

Clocking signal 31 passes through frequency divider 15 (arrow 46), where it is divided by "N2". From there, it passes through DLLP circuitry 12 to phase comparator 14 (arrow 47). Phase comparator 14 compares 49 the arrival times of clocking signal 31 and feedback signal 17 (arrow 50), and provides this information 51 to DLLP circuitry 12 (arrow 52). DLLP circuitry 12 determines 54 a delay between clocking signal 31 and feedback signal 17 based on their arrival times. This delay corresponds to the difference it takes for the same signal to traverse DLLP 2 and clock distribution network 5. The delay is then stored 55 in DLLP circuitry 12, and DLLP circuitry 12 is turned "OFF" (i.e., it is locked). In this state, DLLP circuitry 12 applies the stored delay to signals that are passed through DLLP 2, thereby simulating clock distribution network 5. When locked, DLLP circuitry 12 does not calculate a new delay.

Figure 4:
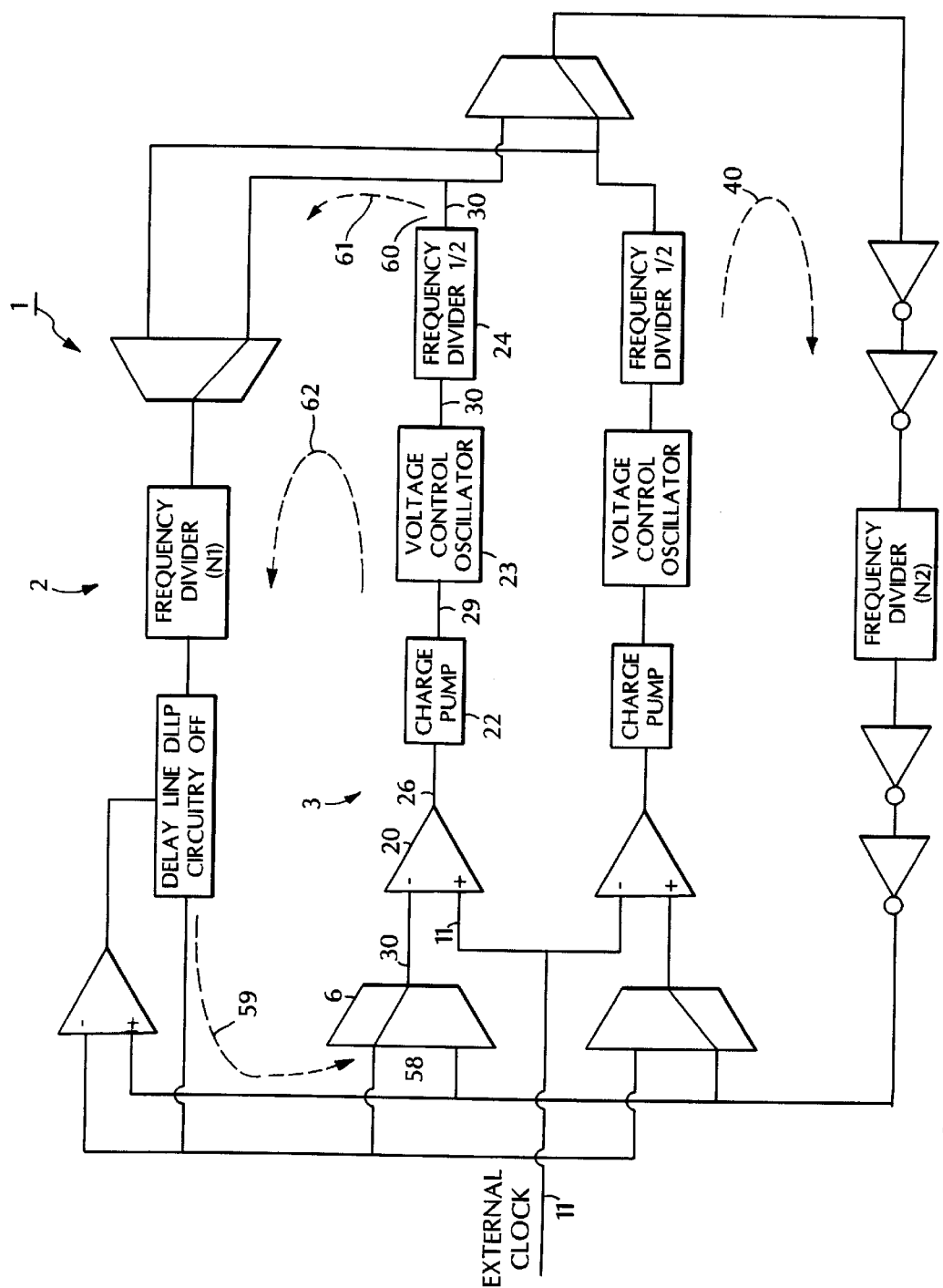

State machines or the like (not shown) in clocking circuitry 1 then set 56 the frequency of DLLP 2 to the target frequency. This is done by changing the values of the divider in frequency divider 15 to "N1", if necessary (see FIG. 4). If this value is already "N1", changing it is not necessary. At or about the same time, in 57, switches 6 and 9 switch an input 58 (see arrow 59) and an output 60 (see arrow 61), respectively, of first PLL 3 into DLLP 2. As a result, clocking signal 30 flows through the loop of arrow 62 (with the replicated clock distribution network delay in DLLP circuitry 12) at the target frequency. Meanwhile, clocking signal 31 continues through clock distribution network 5 as shown by arrow 40.

First PLL 3 then locks 64 in phase with external clocking signal 11. Specifically, phase comparator 20 determines the difference in arrival times between clocking signal 30 and external clocking signal 11, detects any difference in phase based on these arrival times, and outputs a control signal 26 to charge pump 22. Charge pump 22 outputs a voltage 29 based on control signal 26, which causes VCO 23 to change clocking signal 30 accordingly. Thereafter, further changes may be made to clocking signal 30, if necessary, to complete locking in 64.

Figure 5:
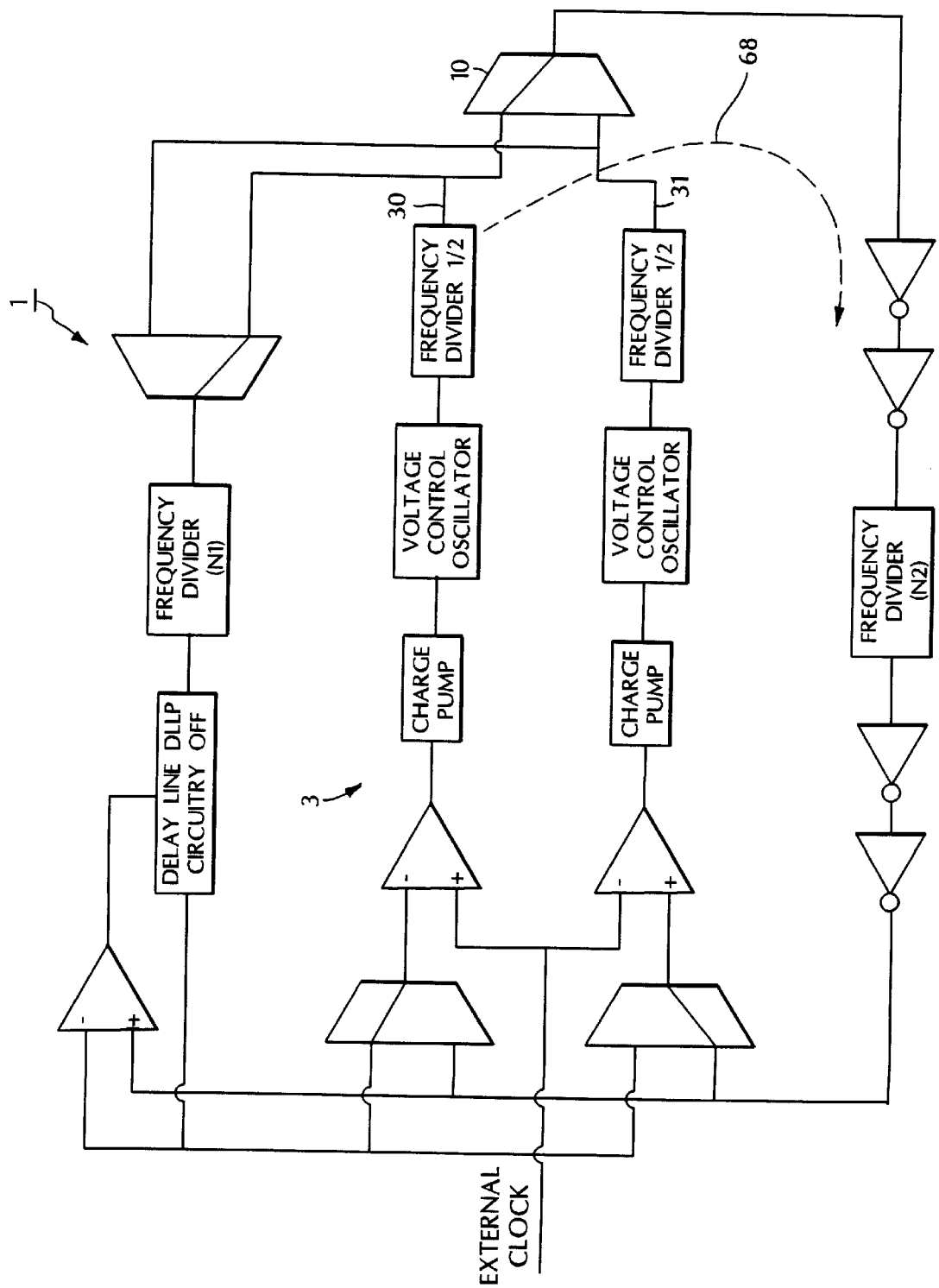

Returning to FIG. 3, following locking 42, clocking circuitry 1 substitutes 66 first PLL 3 for second PLL 4 in clock distribution network 5. Specifically, switch 10 is reconfigured, as shown in FIG. 5, so that clock signal 30 of first PLL 3 is switched 67 into clock distribution network 5 (see arrow 68). At the same time, clock signal 31 is switched out of clock distribution network 5.

Figure 6:
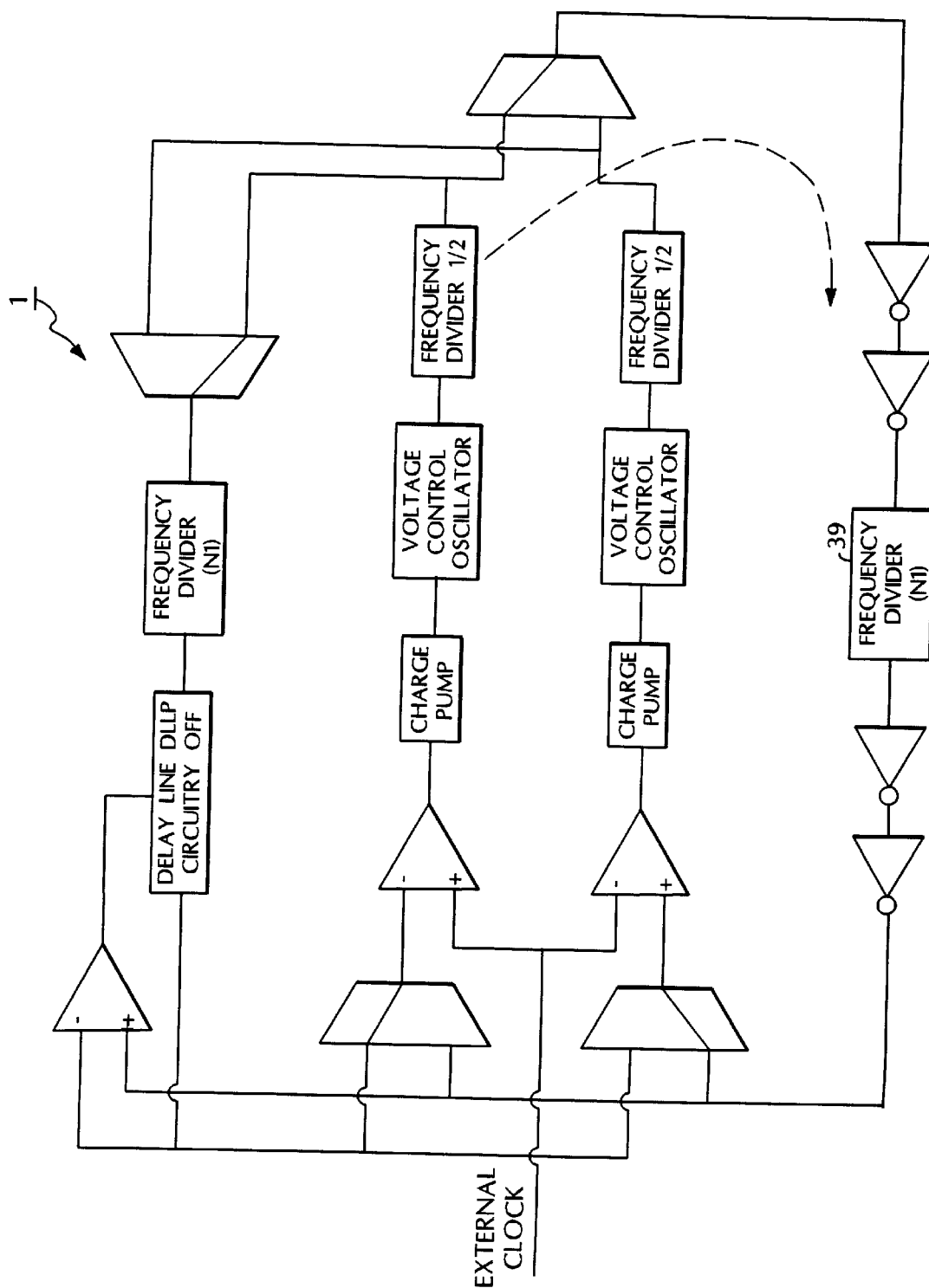

Next, clocking circuitry 1 sets 69 the frequency of clock distribution network 5 to the target frequency. This is done by changing the divider value in frequency divider 39 from "N2" to "N1" (see FIG. 6). In 70, clocking circuitry 1 switches feedback signal 17 into an input of first PLL 3 (see arrow 72 in FIG. 7) so that first PLL 3 replaces second PLL 4 on clock distribution network 5. This is done by reconfiguring switch 7 so that signals are not provided to second PLL 4 and reconfiguring switch 6 so that feedback signal 17 is provided to phase comparator 20. This leaves second PLL 4 idle and first PLL 3 driving clock distribution network 5 (clocking signal 30 is the core clock) at the target frequency.

Figure 7:
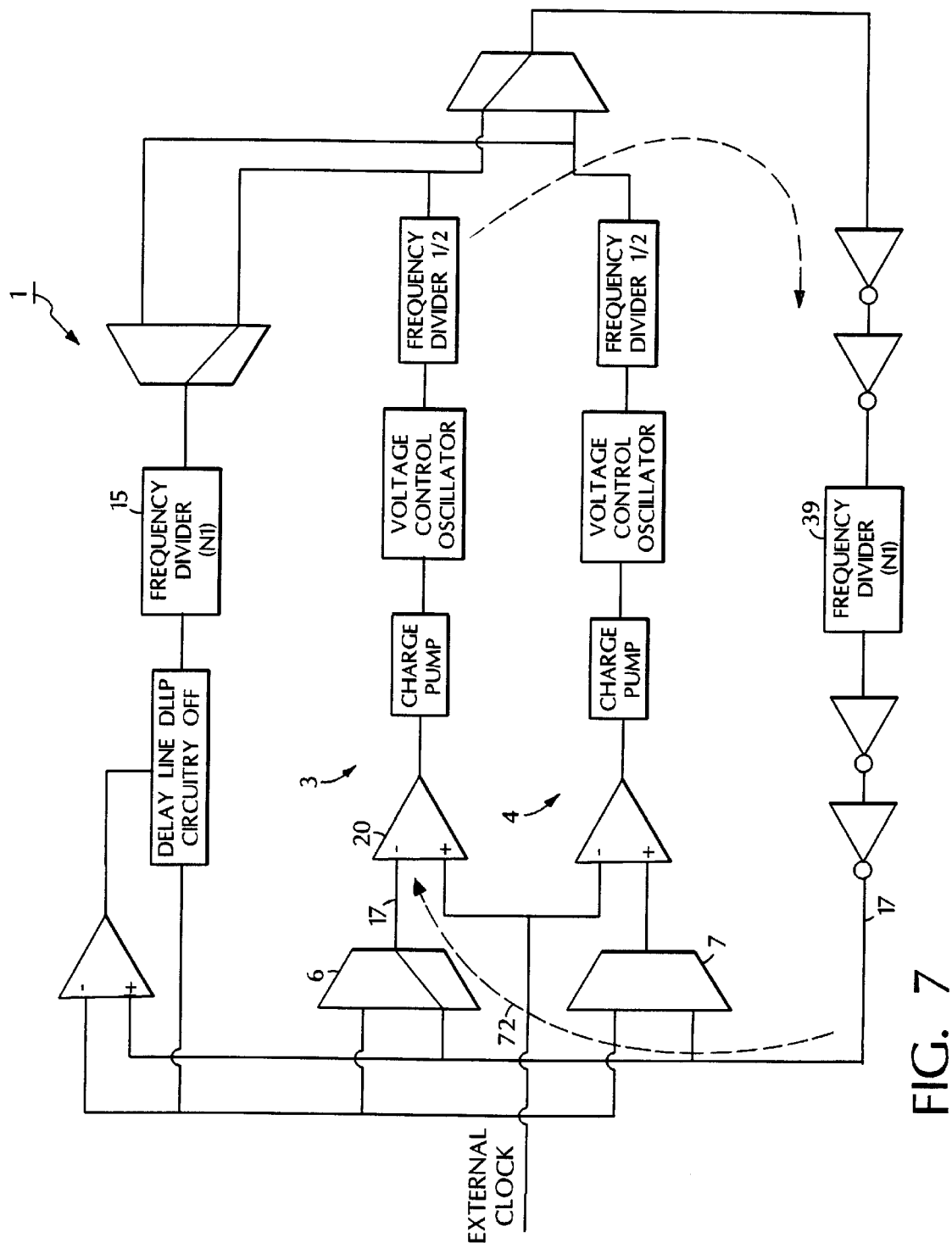

In FIG. 7, first PLL 3 is in the same state as was second PLL 4 in FIG. 2, and vice versa. For example, first PLL 3 is driving clock distribution network 5 and second PLL 4 is idle. Also, frequency dividers 15 and 39 both have the same value in FIG. 7, as was the case in FIG. 2.

Thus, it is possible to switch from the target frequency back to the initial frequency using the process of FIG. 3 by substituting the first PLL for the second PLL, the second PLL for the first PLL, and "N1" for "N2". Similarly, clocking circuitry 1 could be switched to a frequency other than the initial or target frequencies.

For example, the locking 42 and substituting 66 (FIG. 3) can be repeated several times (each time switching the roles of first PLL 3 and second PLL 4) in order to change frequency gradually. In this manner, the frequency could be stepped-up or stepped-down, such as to zero during shut-down. Making frequency changes gradually reduces current spikes and unwanted transients in microprocessor circuitry.

If necessary, clocking circuitry 1 may insert an idle state at the time of transition (namely, substituting 66) between the initial and target frequencies. This may be done if clocking circuitry 1 is inelastic, meaning that it does not function normally during frequency transitions.

Other embodiments are within the scope of the following claims. For example, the invention can also be used in other devices, such as a digital signal processor ("DSP"). The invention is also not limited to the particular hardware configuration shown in the figures. For example, other switches may be used in place of multiplexers. The process of FIG. 3 need not be executed in the exact order shown. For example, 67, 69 and 70 could be performed substantially simultaneously, or in a different order. The same is true for 45 and 56.

What is claimed is:

1. A method of switching a clocked device from an initial frequency to a target frequency, comprising:
   locking a first phase locked loop (PLL) to the target frequency while a second PLL is driving a clock distribution network at the initial frequency; and
   substituting the first PLL for the second PLL on the clock distribution network.

2. A method according to claim 1, wherein the locking comprises:
   setting the first PLL to the target frequency; and
   locking the first PLL in phase with an external clocking signal.

3. A method according to claim 2, wherein the setting comprises:
   tuning a delay locked loop (DLLP) to a delay of the clock distribution network;
   setting a frequency of the DLLP to the target frequency; and
   switching an input and an output of the first PLL into the DLLP so that the first PLL is at the target frequency.

4. A method according to claim 3, wherein the tuning comprises:
   comparing a feedback from the clock distribution network to an output of the second PLL;
   determining the delay based on the comparing; and
   storing the delay in a circuit on the DLLP.

5. A method according to claim 3, wherein the setting comprises changing a value of a frequency divider in the DLLP.

6. A method according to claim 3, wherein the switching is performed using multiplexers.

7. A method according to claim 1, wherein the substituting comprises:
   switching an output of the first PLL into the clock distribution network;
   setting a frequency of the clock distribution network to the target frequency; and
   switching a feedback from the clock distribution network into an input of the first PLL.

8. A method according to claim 7, wherein the setting comprises changing a value of a frequency divider in the clock distribution network.

9. A method according to claim 1, further comprising idling a processor in which the method is performed during a transition from the initial frequency to the target frequency.

10. A method according to claim 1, further comprising performing the locking and the substituting several times in order to change from the initial frequency.

11. A method of switching a frequency of a clock distribution network in a processor, comprising:
   tuning a delay locked loop (DLLP) to a delay of the clock distribution network;
   setting the DLLP to a target frequency;
   switching an input and an output of a first phase locked loop (PLL) into the DLLP so that the first PLL is at the target frequency;
   locking the first PLL in phase with an external clocking signal while a second PLL is driving the clock distribution network;
   substituting an output of the first PLL for an output of the second PLL on the clock distribution network;
   setting a frequency of the clock distribution network to the target frequency; and
   switching a feedback from the clock distribution network from an input of the second PLL into an input of the first PLL.

12. An apparatus which switches a clocked device from an initial frequency to a target frequency, comprising:
   a first phase locked loop (PLL) which locks at the target frequency;
   a second PLL which drives a clock distribution network at the initial frequency; and
   switches which substitute the first PLL for the second PLL on the clock distribution network.

13. An apparatus according to claim 12, further comprising circuitry which locks the first PLL at the target frequency by (i) setting the first PLL to the target frequency, and (ii) locking the first PLL in phase with an external clocking signal.

14. An apparatus according to claim 13, wherein the circuitry comprises:
   a delay locked loop (DLLP) tuned to a delay of the clock distribution network, the DLLP including a frequency divider set in accordance with the target frequency;
   additional switches which switch an input and an output of the first PLL into the DLLP so that the first PLL is at the target frequency; and
   circuitry which locks the first PLL at the target frequency in phase with an external clocking signal.

15. An apparatus according to claim 14, wherein the DLLP:
   compares a feedback from the clock distribution network to an output of the second PLL;
   determines the delay based on the comparing; and
   stores the delay in a circuit.

16. An apparatus according to claim 12, wherein the switches comprise multiplexers.

17. An apparatus according to claim 12, wherein the switches comprise a first switch which switches an output of the first PLL into the clock distribution network and a second switch which switches a feedback from the clock distribution network into an input of the first PLL.

18. An apparatus according to claim 12, wherein the second PLL includes a frequency divider that is set in accordance with the target frequency when the switches substitute the first PLL for the second PLL.

19. A microprocessor which includes the apparatus of claim 12.

20. A microprocessor according to claim 19, which is idled during a transition from the initial frequency to the target frequency.

21. An apparatus for switching a frequency of a clock distribution network in a processor, comprising:
   a delay locked loop (DLLP) tuned to a delay of the clock distribution network;
   a frequency divider in the DLLP set in accordance with a target frequency;
   circuitry which locks a first phase locked loop (PLL) to the target frequency via the DLLP while a second PLL is driving the clock distribution network;
   switches which substitute an output of the first PLL for an output of the second PLL on the clock distribution network, and which switch a feedback from the clock distribution network from an input of the second PLL into an input of the first PLL; and
   a frequency divider in the clock distribution network that is set in accordance with the target frequency based on a time of operation of the switches.

22. An apparatus according to claim 21, wherein the circuitry comprises:
   a phase comparator which detects a difference in phase between a clocking signal output from the DLLP and an external clocking signal, and which outputs a control signal based on the difference;
   a charge pump which outputs voltage based on the control signal from the phase detector; and
   a voltage control oscillator which outputs a clocking signal based on the voltage output from the charge pump.

23. A method of switching a clock distribution network from an initial frequency to a target frequency, comprising:

simulating the clock distribution network;

locking a first phased locked loop (PLL) to a target frequency via the simulated clock distribution network while a second PLL is driving the clock distribution network at the initial frequency; and replacing the second PLL with the first PLL on the clock distribution network.

24. A method according to claim 23, wherein:

the simulated clock distribution network comprises a delay locked loop (DLLP) having substantially a same delay as the clock distribution network; and the locking comprises:

setting a frequency of the DLLP to the target frequency; and locking the first PLL in phase with an external clocking signal.

* * * * *